(12) United States Patent
Pantelakis et al.

(10) Patent No.: US 6,275,070 B1
(45) Date of Patent: Aug. 14, 2001

(54) INTEGRATED CIRCUIT HAVING A HIGH SPEED CLOCK INPUT BUFFER

(75) Inventors: Dimitris C. Pantelakis; Wai Tong Lau, both of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/399,028

(22) Filed: Sep. 21, 1999

(51) Int. Cl.$^7$ .................... H03K 19/096; H03L 5/00
(52) U.S. Cl. .................... 326/98; 326/93; 326/95; 326/98; 326/62; 326/68; 326/80; 327/333
(58) Field of Search .................... 326/62, 68, 80, 326/81, 93, 95, 98, 83; 327/333

(56) References Cited

U.S. PATENT DOCUMENTS

| | | | |
|---|---|---|---|
| 5,144,165 | 9/1992 | Dhong et al. ............... | 307/451 |
| 5,300,835 | 4/1994 | Assar et al. ............... | 307/475 |
| 5,546,355 | 8/1996 | Raatz et al. ............... | 365/233 |
| 5,818,258 | * 10/1998 | Choi .......................... | 326/83 |
| 5,926,055 | * 7/1999 | Kashmiri et al. ............ | 327/333 |
| 6,043,699 | * 3/2000 | Shimizu .................... | 327/333 |
| 6,054,875 | * 4/2000 | Wayner ...................... | 326/83 |
| 6,094,083 | * 7/2000 | Noda ........................ | 327/333 |
| 6,097,214 | * 8/2000 | Troussel et al. ............. | 326/63 |

\* cited by examiner

*Primary Examiner*—Michael Tokar
*Assistant Examiner*—Vibol Tan
(74) *Attorney, Agent, or Firm*—Daniel D.. Hill

(57) ABSTRACT

An integrated circuit (100) includes an input buffer circuit (122) having an input stage (150), a delay element (178), inverter (176), and a level shifter (156). The input stage (150) receives an input signal and a first power supply voltage. The level shifter (156) has a pair of cross-coupled P-channel transistors (158 and 160) coupled to a second power supply voltage. The second power supply voltage is different than the first power supply voltage. The cross-coupled P-channel transistors (158 and 160) are coupled to first and second N-channel transistors (162 and 164). Each of the first and second N-channel transistors (162 and 164) and transistors (152, 154) of the input stage (150) have relatively thick oxide layers. A gate of the first N-channel transistor (162) is coupled to the output of the input stage (150). A gate of the second N-channel transistor (164) is coupled to receive the input signal. The level shifter (156) provides a high speed level shifted output signal at the second power supply voltage level.

18 Claims, 4 Drawing Sheets

INTEGRATED CIRCUIT HAVING A HIGH SPEED CLOCK INPUT BUFFER

CROSS REFERENCE TO RELATED, COPENDING APPLICATION

The present application is related to the following U.S. patent application: "OUTPUT BUFFER CIRCUIT AND METHOD OF OPERATION", invented by Lloyd P. Matthews, application Ser. No. 09/258,378, filed on Feb. 26, 1999 and assigned to the assignee hereof.

FIELD OF THE INVENTION

The present invention relates in general to integrated circuits, and more particularly to an integrated circuit memory having a high speed clock input buffer.

BACKGROUND OF THE INVENTION

Integrated circuit static random access memories (SRAMs) are used in a variety of applications today. In particular, high speed synchronous SRAMs are used in such applications as caches for computer systems, work stations, and the like. These cache memories provide a high speed storage of data or instructions that are likely to be reused. As integrated circuit technology has improved, microprocessors have correspondingly increased in speed and as microprocessor speed increases the access time of the SRAMs must decrease to provide efficient cache storage.

Integrated circuits (ICs) that are used in modern electrical systems must be designed to effectively and efficiently communicate between different types of devices that are powered by different voltage supplies. For example, it is not unusual for a 3.3 volt microcontroller unit (MCU), to be coupled to a 1.8 volt memory device. In order for these devices to effectively communicate with each other in an electrical design, the input and output buffers of the ICs must be able to accommodate different voltages.

As CMOS (complementary metal-oxide semiconductor) technologies migrate to higher performance, small device sizes, and lower power supply voltages, for example, 1.8 volts, the CMOS transistors cannot tolerate higher voltages, for example, more than 2.5 volts. In a high performance synchronous memory, all inputs have to endure high voltage stress and step down, or level shift, the higher voltage input signal (e.g. 3.3 volts) to the lower internal voltages (e.g. 1.8 volts). To handle the stress of higher input voltages, thicker oxide transistors are required. However, the switching speed of these thicker oxide transistors is generally slower. Also, the thicker oxide transistors have longer channel lengths and higher threshold voltages which tends to reduce their switching speed. In addition, the level shifting operation also tends the slow the speed of the input buffer.

The above issues can be illustrated with respect to FIG. 1. FIG. 1 illustrates a conventional input buffer circuit 10 that is currently used in the IC industry for buffering input clock signals for a synchronous memory. Circuit 10 is provided with a clock input signal (CLOCK) and a control signal (SLEEP), and provides differential clock signals CLK and CLKB as shown in FIG. 1. Circuit 10 includes an inverter 12, N-channel transistor 16, P-channel transistor 14, latch 18, and inverter 20. Inverter 12 includes N-channel transistor 15 and P-channel transistor 13. The CLOCK signal is provided as an input to the gates of transistors 13 and 15. The SLEEPB control signal is active as a logic low and causes N-channel transistor 16 to be off, thus preventing current flow through transistors 13 and 15 when the SLEEPH control signal is active. Also, when SLEEPB is active, P-channel transistor 14 is on causing the output terminal of inverter 12 to be a logic high irregardless of the logic state of signal CLOCK.

Latch 18 has an input coupled to the output of inverter 12, and an output coupled to the input of inverter 20. Inverter 20 provides a buffered clock signal CLK, and the output of inverter 12 provides a logical complement of signal CLK labeled "CLKB". Circuit 10 is supplied with a power supply voltage labeled "VDD". The level shifting of clock signal CLOCK is done by transistors 13, 15, and 16. Latch 18 is required to provide hysteresis.

Circuit 10 is designed to interface with an external circuit that operates at the same power supply voltage VDD. The external circuit provides clock signal CLOCK to circuit 10 as a "rail-to-rail" signal at about VDD. The transistors of circuit 10 all contain equal gate oxide thickness layers. The trip point of inverter 12 is determined by the relative sizes of transistors 13 and 15. If circuit 10 was used to interface with an external circuit that provided the clock signal at a higher voltage than VDD, transistors 13 and 15 may need to be fabricated with a thicker gate oxide to handle the higher voltage clock signal. However, converting transistors 13 and 15 to have relatively thicker gate oxide layers does not result in a high speed clock input buffer. To satisfy the trip point requirement, transistor 13 would have to be made excessively large or the size of transistor 15 would have to be made excessively small, which would further degrade performance.

FIG. 2 illustrates another conventional input buffer circuit 30 that is currently used in the IC industry. Input buffer circuit 30 includes series-connected inverters 32 and 34 and is for buffering input signals from an IC operating at a first power supply voltage (e.g. 3.3 volts) VDDX and another IC operating at a second lower power supply voltage VDD (e.g. 1.8 volts). Each of the transistors of input buffer circuit 30 have relatively thicker gate oxide layers to handle the stress from the higher power supply voltage VDDX and the input signal CLOCK. Inverter 34 provides a level shifting function.

Input buffer circuits 10 and 30 both suffer from some of the same disadvantages. The thicker oxide transistors have a slower switching speed than their thin oxide counterparts. Also, the level shifter increases propagation delay. Because in synchronous integrated circuits, such as a synchronous memory, the clock marks the beginning of a cycle, the faster the clock is, the faster the memory can operate. The above conventional input buffer circuits 10 and 30 are generally inadequate for high speed operation when a level shifting function is required.

Therefore, a need exists in the industry to improve the performance and response time of clock input buffers for synchronous integrated circuits, such as synchronous memories, while simultaneously ensuring that voltage compatibility is still adequate. Such an integrated circuit is provided by the present invention, whose features and advantages will be better understood with the attached drawings in conjunction with the following detailed description.

DESCRIPTION OF A PREFERRED EMBODIMENT

Generally, the present invention provides an input buffer circuit having an input stage and a level shifter. The input stage has an input terminal for receiving the input signal and is coupled to a first power supply voltage terminal for receiving a first power supply voltage. The level shifter has a pair of cross-coupled P-channel transistors coupled to a second power supply voltage terminal for receiving a second power supply voltage. The second power supply voltage is different than the first power supply voltage. The cross-coupled P-channel transistors are coupled to first and second N-channel transistors. Each of the first and second N-channel transistors have a relatively thick oxide layer. A gate of the first N-channel transistor is coupled to the output terminal of the input stage and a gate of the second N-channel transistor is coupled to receive the input signal. The level shifter provides a level shifted output signal at the second power supply voltage level very quickly because the cross-coupled P-channel transistors do not require a relatively thick oxide layer to handle high voltage stress.

Figure 1:
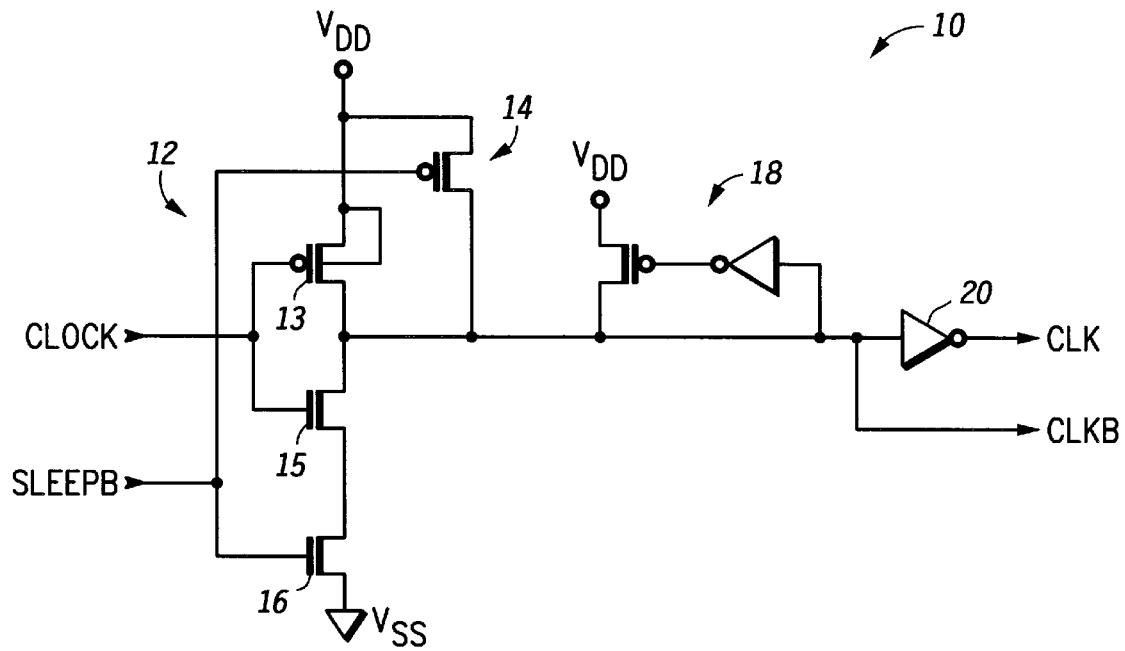
FIG. 1 illustrates, in schematic diagram form, an input buffer circuit in accordance with the prior art.
Figure 2:
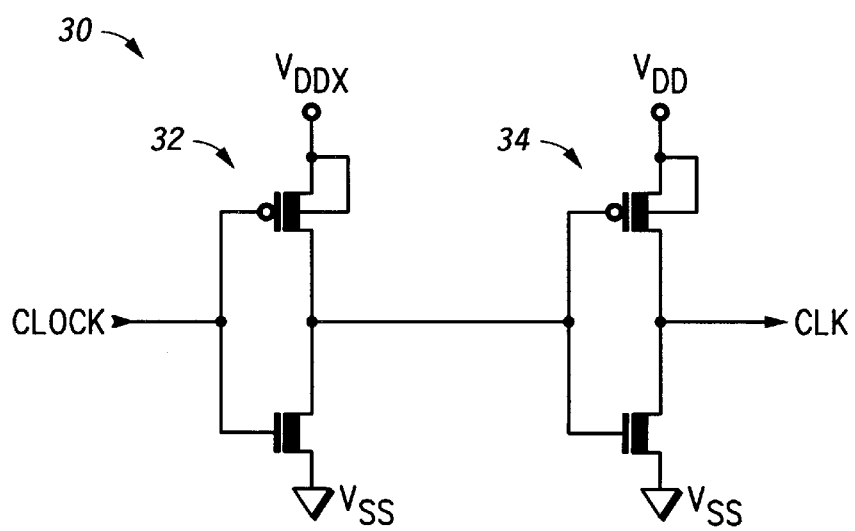
FIG. 2 illustrates, in schematic diagram form, another input buffer circuit in accordance with the prior art.
Figure 3:
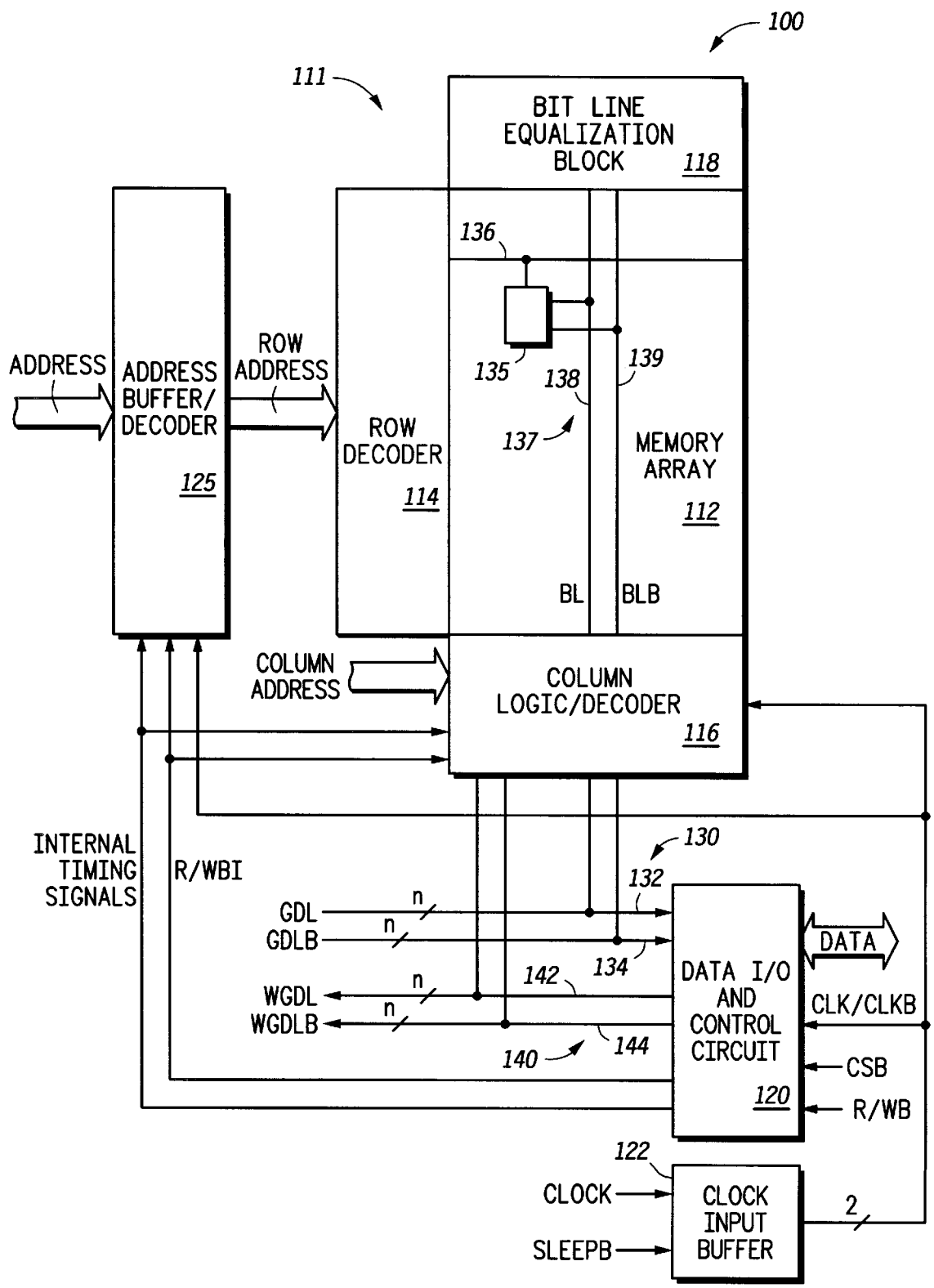
FIG. 3 illustrates, in block diagram form, a memory in accordance with the present invention.

FIG. 3 illustrates, in block diagram form, a memory 100 in accordance with the present invention. Memory 100 generally includes a clock input buffer 122, an address buffer/decoder 125, a memory array portion 111, a data I/O and control circuit 120, a read global data line bus 130, and a write global data line bus 140. Memory array portion 111 may be partitioned into array halves or quadrants, and may also include one or more blocks. Memory array portion 111 includes a memory array 112, a row decoder 114, a column logic/decoder 116, and a bit line equalization block 118. Memory array 112 includes an array of memory cells located at intersections of word lines and bit line pairs. Shown in FIG. 3 is a representative memory cell 135 located at an intersection of a word line 136 and a bit line pair 137. Bit line pair 137 includes a first bit line 138 conducting a signal labeled "BL", and a second bit line 139 conducting a signal labeled "BLB". Note that the "B" at the end of a signal name indicates that the signal is the logical complement of a signal having the same name but lacking the "B". Read global data line bus 130 includes n complementary pairs of global data lines, including a first global data line 132 labeled "GDL" and a second global data line 134 labeled "GDLB". Write global data line bus 140 also includes n complementary write global data lines including a first write global data line (WGDL) 142 and a second write global data line 144 (WGDLB).

Address buffer/decoder 125 receives an input address labeled "ADDRESS". Address buffer/decoder 125 also receives a group of control signals labeled "INTERNAL TIMING SIGNALS", and a signal labeled "R/WBI". Address buffer/decoder 125 receives and separates the ADDRESS into a row component labeled "ROW ADDRESS" and a column component labeled "COLUMN ADDRESS". Note that the address buffer/decoder 125 may perform partial or fall decoding on the ADDRESS to obtain the ROW ADDRESS and the COLUMN ADDRESS.

In memory block 111, row decoder 114 receives the ROW ADDRESS, and activates a word line in response. Memory array 112 is connected to each of the word lines connected to the output of row decoder 114. Memory cells in memory array 112 are located at intersections of corresponding word lines and corresponding bit line pairs. Each bit line pair serves as an input to the memory cells during the write cycle of memory 100 and as an output during the read cycle. Bit line equalization block 118 represents bit line equalization transistors (shorting devices) which are connected to one end of each of the bit lines.

Column logic/decoder 116 receives the COLUMN ADDRESS, the INTERNAL CLOCKS, and the R/WBI signal. Column logic/decoder 116 is connected to each bit line pair, including representative bit line pair 154, and is located at the end of the bit lines opposite to bit line equalization block 118. In the illustrated embodiment, column logic/decoder 116 also includes bit line loads. These bit line loads include both an equalization transistor and a precharge transistor for each bit line. Column logic/decoder 116 is connected to read global data line bus 130 and write global data line bus 140. Each global data line bus includes n signal lines, where n may be any arbitrary number such as 1, 2, 4, 8, 16, 32, etc. depending on the size of memory 100.

Data I/O and control circuit 120 is connected to read global data line bus 130 and write global data line bus 140, and has a bidirectional terminal for conducting an n-bit signal labeled "DATA". Data I/O and control circuit 120 also has input terminals for receiving external control signals labeled "CSB", "R/WB", and "CLK/CLKB", and output terminals for providing the INTERNAL TIMING SIGNALS and the R/WBI signals.

The clock input buffer 122 has an input terminal for receiving a clock input signal labeled "CLOCK", and an input terminal for receiving a control signal labeled "SLEEPB". The CLOCK input signal is provided by a microcontroller, microprocessor, or the like, which operates at a high power supply voltage than the internal operating power supply voltage of memory 100. Assume for illustration purposes that the clock signal is generated at 3.3 volts and the internal operating power supply voltage of memory 100 is 1.8 volts. Clock input buffer 122 receives the 3.3 volt clock signal CLOCK, performs a level shifting operation, and provides differential clock signals CLK and CLKB at 1.8 volts to data I/O and control circuit 120, address buffer/decoder 125, and column logic/decoder 116. The operation of clock input buffer 122 will be discussed in more detail in the discussion of FIGS. 4–6. Note that in the illustrated embodiment, memory 100 is a synchronous static random access memory (SRAM) and generates the INTERNAL TIMING SIGNALS synchronously with the clock signal CLOCK. However, in other embodiments, clock input buffer 122 may be implemented in any integrated circuit device requiring a high speed clock signal input that is received at a voltage higher than the internal operating voltage of the integrated circuit device.

In basic operation, address buffer/decoder 125 receives the ADDRESS during a read cycle or a write cycle of memory 100. In the read cycle, signal CSB is activated and R/WB is a logic high; during the write cycle, signal CSB is activated and signal R/WB is a logic low. Signals R/WBI are buffered from input signals R/WB and are substantially the same signals. Row decoder 114 enables one word line in response to receiving the ROW ADDRESS. During the read cycle, each memory cell which is connected to an enabled word line is selected and couples its output as a differential current on a bit line pair to which it is coupled. For example, when the ROW ADDRESS enables word line 136, memory cell 135 is selected and provides a differential current to bit line pair 137 representative of the state of the bit stored therein. All bit line pairs are driven during the read cycle by memory cells connected to the enabled word line. The signals on all bit line pairs are differential currents.

Column logic/decoder 116 selects n bit line pairs based on the COLUMN ADDRESS. The INTERNAL TIMING SIGNALS provide information to column logic/decoder 116 that an operation has begun, and R/WB determines whether a read cycle or a write cycle is in progress. After selecting the bit line pair or pairs based on the column address, column logic/decoder 116 connects each of the selected bit line pairs to a corresponding global data line pair and amplifies a signal thereon using differential current sensing techniques. In response to CSB and RIWB indicating a read cycle, data I/O and control circuit 120 receives a differential signal on each read global data line pair, converts it to a single ended signal, and outputs DATA.

During the write cycle, the flow of data is essentially reversed. A write cycle is signified by signal CSB becoming active and R/WB being a logic low. Data I/O circuit 120 receives DATA as an input, and drives each DATA signal as a differential signal on a corresponding write global data line pair. For example, write global data line bus 140 is representative of each selected write global data line pair in memory 100. Write global data line bus 140 is driven by data I/O and control circuit 120 based on the received DATA. In response to the INTERNAL TIMING SIGNALS, RIWBI, and the COLUMN ADDRESS, column logic/decoder 116 couples each write global data line pair to a selected bit line pair. Row decoder 114 enables a word line and the input data is driven into memory cells located at intersections of enabled word lines and selected bit line pairs. As in the read cycle, memory cells located on an enabled word line have outputs coupled to bit line pairs. However a voltage differential driven on bit line pairs by column logic/decoder 116 is greater than the drive voltage of the memory cell and overwrites a stored bit in the memory cell.

Figure 4:
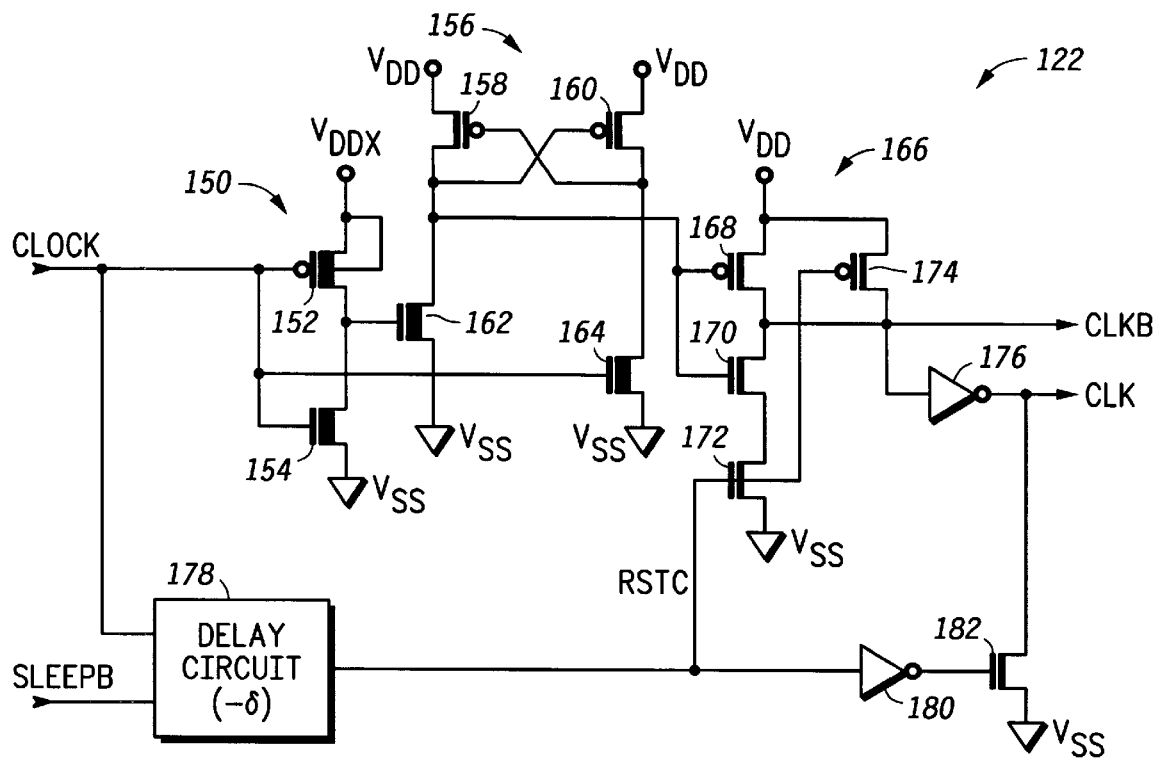
FIG. 4 illustrates, in schematic diagram form, one embodiment of the clock input buffer circuit of the memory of FIG. 3.

FIG. 4 illustrates, in schematic diagram form, an embodiment of clock input buffer 122 of memory 100. Clock input buffer 122 includes inverter 150, high speed level shifter 156, inverter 166, delay circuit 178, P-channel transistor 174, N-channel transistors 172 and 182, and inverters 176 and 180. Inverter 150 includes P-channel transistor 152 and N-channel transistor 154. Level shifter 156 includes P-channel transistors 158 and 160 and N-channel transistors 162 and 164. Inverter 166 includes P-channel transistor 168 and N-channel transistor 170.

In inverter 150, P-channel transistor 152 has a source, or current electrode, coupled to a power supply voltage terminal labeled "V$_{DDX}$", drain, or current electrode, and a gate, or control electrode, for receiving clock signal CLOCK. Clock signal CLOCK is generated external to memory 100, and is provided at about the same voltage level as the power supply voltage provided to V$_{DDX}$. N-channel transistor 154 has a drain connected to the drain of P-channel transistor 152, a source connected to a ground terminal labeled "V$_{SS}$", and a gate connected to the gate of P-channel transistor 152. Inverter 150 functions as the input stage of clock input buffer 122.

In level shifter 156, P-channel transistors 158 and 160 are cross-coupled. P-channel transistor 158 has a source connected a power supply voltage terminal labeled "V$_{DD}$", a drain, and a gate. P-channel transistor 160 has a source connected to V$_{DD}$, a drain connected to the gate of P-channel transistor 158, and a gate connected to the drain of P-channel transistor 158. N-channel transistor 162 has a drain connected to the drain of P-channel transistor 158, a source connected to V$_{SS}$, and a gate connected to the drain of P-channel transistor 152. N-channel transistor 164 has a drain connected to the drain of P-channel transistor 160, a source connected to V$_{SS}$, and a gate connected to the gate of P-channel transistor 152 for receiving clock input signal CLOCK.

P-channel transistor 168 has a source connected to V$_{DD}$, a drain for providing a clock signal labeled "CLKB", and a gate connected to the drain of P-channel transistor 158. N-channel transistor 170 has a drain connected to the drain of P-channel transistor 168, a source, and a gate connected to the gate of P-channel transistor 168. N-channel transistor 172 has a drain connected to the source of N-channel transistor 170, a source connected to V$_{SS}$, and a gate. P-channel transistor 174 has a source connected to V$_{DD}$, a drain connected to the drain of P-channel transistor 168, and a gate connected to the gate of N-channel transistor 172. Inverter 176 has an input terminal connected to the drain of P-channel transistor 168, and an output terminal for providing clock signal "CLK". Delay circuit 178 has an input terminal for receiving clock input signal CLOCK, an input terminal for receiving a control signal labeled "SLEEPB", and an output terminal connected to the gate of P-channel transistor 174 and N-channel transistor 172. Inverter 180 has an input terminal connected to the output terminal of delay circuit 178, and an output terminal. N-channel transistor 182 has a drain connected to the output terminal of inverter 176, a gate connected to the output terminal of inverter 180, and a source connected to V$_{SS}$.

Note that a bulk connection of shown for P-channel transistor 152. Although not shown, a bulk connection exists for each of the other transistors. The bulk connection can be to either the substrate or to a well region of the integrated circuit depending on the transistor conductivity type and/or process.

Figure 5:
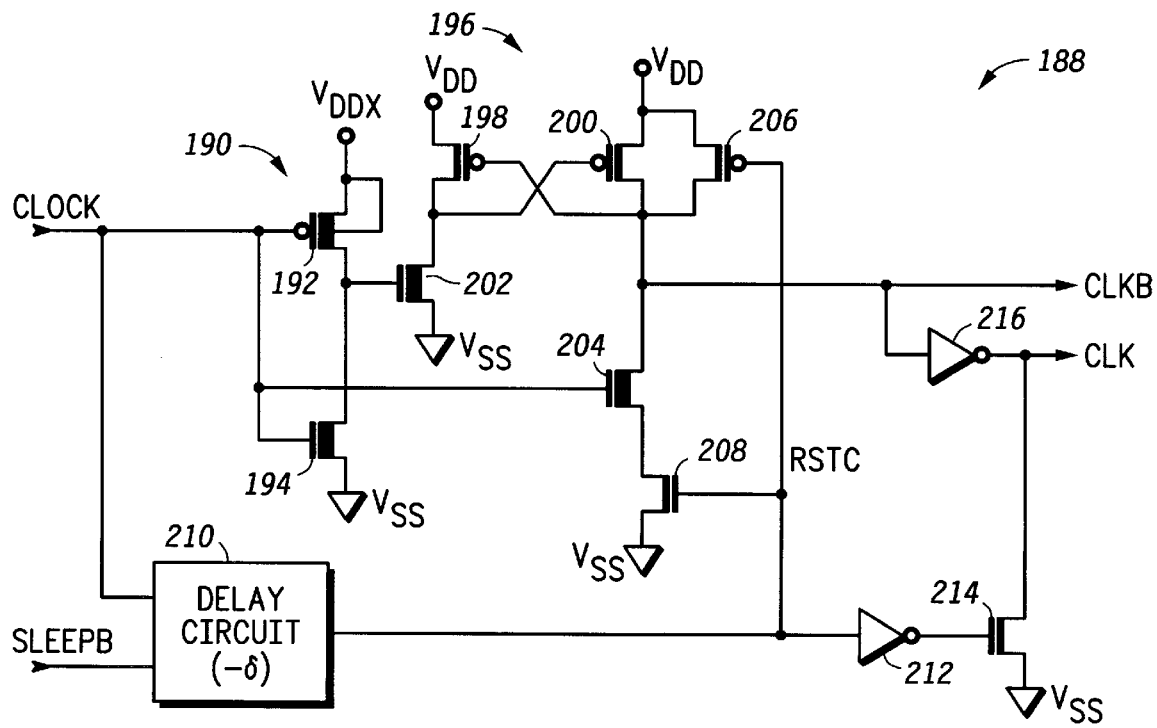
FIG. 5 illustrates, in schematic diagram form, another embodiment of the clock input buffer circuit of the memory of FIG. 3.

Note that in FIG. 4 and FIG. 5 each of the transistors having a thicker gate terminal are implemented as high voltage metal-oxide semiconductor (MOS) devices that are intended to operate at the lower power supply voltages, e.g., 1.8 volts, yet be tolerant to relatively higher voltages, e.g., 3.3 volts. These transistors may be different than low voltage transistors in several ways, such as for example, relative thickness of the gate oxide, source/drain implants, bulk resistivity, channel lengths, etc. All of the other transistors are considered low voltage MOS transistors of FIG. 4 and FIG. 5.

Clock signal CLOCK is provided by an IC, such as a microcontroller or microprocessor, or the like, that operates at a higher voltage (V$_{DDX}$) than the operating voltage of memory 100 (V$_{DD}$). To reduce the stress of the higher voltage, the gate oxide of transistors 152, 154, 162 and 164 are thicker, and the channel lengths are longer, than the gate oxide and channel lengths of the other transistors which are designed to operate at the lower power supply voltage V$_{DD}$. In the illustrated embodiments, V$_{DDX}$ is about 3.3 volts and V$_{DD}$ is about 1.8 volts. Clock signal CLOCK is a "rail-to-rail" 3.3 volt signal. The trip point of inverter 150 is set to a predetermined trip point. The level shifting of the output of inverter 150 is performed by level shifter 156.

In operation, when the input to inverter 150 is a logic high voltage, the output of inverter 150 is a logic low voltage. In level shifter 156, N-channel transistor 162 is substantially non-conductive and N-channel transistor 164 is conductive.

The output of level shifter 156, at the drain of N-channel transistor 162, is pulled high by P-channel transistor 158 which is caused to be conductive by the logic low voltage at the drain of N-channel transistor 164. The logic high voltage at the output of level shifter 156 causes P-channel transistor 160 to be substantially non-conductive. Likewise, when the input to inverter 150 is a logic low voltage, the output of inverter 150 is a logic high voltage. N-channel transistor 162 is conductive and N-channel transistor 164 is substantially nonconductive. P-channel transistor 160 is conductive and P-channel transistor 158 is substantially non-conductive. The output of level shifter 156 is reduced to a logic low voltage by the operation of N-channel transistor 162. Therefore, as clock signal CLOCK toggles between a logic low voltage of 0 volts to a logic high voltage of about 3.3 volts, the output of level shifter 156 toggles between a logic low voltage of 0 volts and a logic high voltage of about 1.8 volts. Because the gates of the pair of cross-coupled P-channel transistors 158 and 160 do not receive the higher input voltage of clock signal CLOCK, they can be have minimum channel lengths and relatively thin gate oxides for a speed advantage.

The output of level shifter 156 is provided to the input terminal of inverter 166 and is at the lower internal power supply voltage V$_{DD}$. The output of inverter 166 provides the output signal. Inverter 176 is used to generate output signal CLK and functions as an output driver circuit. CLK and CLKB are differential clock signals used in the internal timing of memory 100 as described above in the discussion of FIG. 3.

Delay circuit 178, N-channel transistors 172 and 182, P-channel transistor 174, and inverter 180 are used to provide a self-timed internal clock pulse having a fixed duration and duty cycle independent of the duration and duty cycle of externally provided clock signal CLOCK. Delay circuit 178 is typically a series of inverters for providing a complemented (−δ) and delayed output signal labeled "RSTC". In the illustrated embodiment, the delay of delay circuit 178 is set to provide a clock high time of clock signal CLK to be less than the clock high time of clock signal CLOCK. The self-timed function can be better understood by referring to the timing diagram of FIG. 6.

Figure 6:
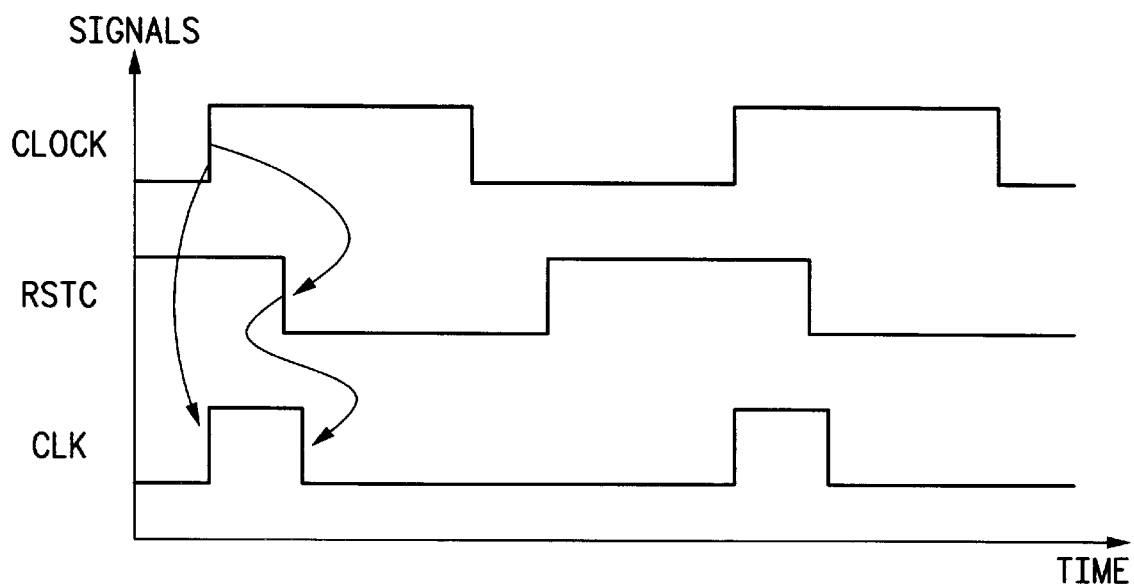
FIG. 6 illustrates a timing diagram of several signals of the clock input buffer circuits of FIG. 4 and FIG. 5.

FIG. 6 illustrates a timing diagram of several signals of the clock input buffer circuits of FIG. 4 and FIG. 5. Note that the embodiment of FIG. 5 will be discussed later. Also note that the timing diagram of FIG. 6 is only intended indicate relative timing of the various signals and is not intended to show that the two embodiments illustrated in FIG. 4 and FIG. 5 have exactly the same timing relationships. The rising edge of clock signal CLOCK causes output signal CLK from input buffer circuit 122 and from input buffer circuit 188 (FIG. 5) to transition from a logic low to a logic high very quickly. A predetermined time after the rising edge of clock signal CLOCK, delay circuit 178 provides a logic low RSTC to the gates of N-channel transistor 172, P-channel transistor 174, and to the input terminal of inverter 180. N-channel transistor 172 becomes substantially non-conductive, decoupling inverter 166 from V$_{SS}$. P-channel transistor 174 becomes conductive, causing the output of inverter 166 to be pulled to a logic high voltage. N-channel transistor 182 is also conductive, pulling the output of inverter 176 low. Output signal CLK becomes a logic low voltage and output signal CLKB is a logic high voltage.

When clock signal CLOCK returns to a logic low, signal RSTC becomes a logic high, causing N-channel transistor 172 to be conductive and causing P-channel transistor 174 to be substantially non-conductive, thus resetting clock input buffer 122 for the next rising edge of clock signal CLOCK.

The self-timing function of clock input buffer 122 provides several advantages. The self-timed internal clock allows the clock buffer to skew toward selection. In other words, the transistors in clock input buffer 122 are sized carefully so that when input signal CLOCK is a logic high, clock input buffer 122 will generate CLK and CLKB as soon as possible. The transistors of inverter 150 are sized so that the drive strength of P-channel transistor 152 is greater than the drive strength of N-channel transistor 154.

Self-timing simplifies the control for the latching and reading of data in a pipeline mode. Also, the self-timed clock is desirable from a testing point of view. Current production testers do not test memory products at their rated speed. By using a self-timed internal clock, the memory works at the rated speed internally even though the external clock signal is running at a lower frequency. Further, the self-timed internal clock causes the memory to operate independently from the external clock. That is, if the external clock changes duty cycle, the internal clock maintains the same duty cycle.

As an option, the self-timing circuits can be used to provide a low power inactive mode of operation for clock input buffer 122. Control signal SLEEPB is active at a logic low. When the control signal SLEEPB is a logic low, signal RSTC is forced to a logic low causing both N-channel transistor 182 and P-channel transistor 174 to be conductive, thus causing output signal CLK to be low and output signal CLKB to be high irregardless of the logic state of clock signal CLOCK. Also, N-channel transistor 172 is substantially non-conductive, preventing a current flow through inverter 166.

FIG. 5 illustrates, in schematic diagram form, another embodiment of the clock input buffer circuit of memory 100 of FIG. 3. Clock input buffer circuit 122, illustrated in FIG. 3 and FIG. 4, can be replaced with clock input buffer 188 of FIG. 5 in another embodiment. Clock input buffer circuit 188 includes inverter 190, level shifter 196, P-channel transistor 206, N-channel transistors 208 and 214, delay circuit 210, and inverter 212 and 216. Inverter 190 includes P-channel transistor 192 and N-channel transistor 194. Level shifter 196 includes P-channel transistors 198 and 200, and N-channel transistors 202 and 204.

In inverter 190, P-channel transistor 192 has a source, or current electrode, coupled to a power supply voltage terminal labeled "V$_{DDX}$", drain, or current electrode, and a gate, or control electrode, for receiving clock signal CLOCK. Clock signal CLOCK is generated external to memory 100, and is provided at about the same voltage level as the power supply voltage provided to V$_{DDX}$. N-channel transistor 194 has a drain connected to the drain of P-channel transistor 192, a source connected to a ground terminal labeled "V$_{SS}$", and a gate connected to the gate of P-channel transistor 192.

In level shifter 196, P-channel transistors 198 and 200 are cross-coupled. P-channel transistor 198 has a source connected a power supply voltage terminal labeled "V$_{DD}$", a drain, and a gate. P-channel transistor 200 has a source connected to V$_{DD}$, a drain connected to the gate of P-channel transistor 198, and a gate connected to the drain of P-channel transistor 198. A level shifted output signal labeled "CLKB" is provided at the drain of P-channel transistor 200. N-channel transistor 202 has a drain connected to the drain of P-channel transistor 198, a source connected to V$_{SS}$, and a gate connected to the drain of P-channel transistor 192. N-channel transistor 204 has a drain connected to the drain of P-channel transistor 200, a source, and a gate connected to the gate of P-channel transistor 192 for receiving clock input signal CLOCK.

N-channel transistor 208 has a drain connected to the source of N-channel transistor 204, a source connected to VSS, and a gate. Delay circuit 210 has an input terminal for receiving clock signal CLOCK, an input terminal for receiving control signal SLEEPB, and an output terminal connected to the gate of N-channel transistor 208. P-channel transistor 206 has a source connected to VDD, a drain connected to the drain of P-channel transistor 200, and a gate connected to the output terminal of delay circuit 210. Inverter 216 has an input terminal connected to the drain of P-channel transistor 200, and an output terminal for providing a clock signal labeled "CLK". Clock signals CLK and CLKB are differential clock signals used for timing the operation of memory 100 as illustrated in FIG. 3. Inverter 212 has an input terminal connected to the output terminal of delay circuit 210, and an output terminal. N-channel transistor 214 has a drain connected to the output terminal of inverter 216, a gate connected to the output terminal of inverter 212, and a source connected to VSS.

As discussed above in the discussion of clock input buffer circuit 122 of FIG. 4, clock signal CLOCK is provided to clock input buffer circuit 188 by an IC that operates at a higher voltage (VDDX) than the operating voltage of memory 100 (VDD). To reduce the stress of the higher voltage, the gate oxide of transistors 192, 194, 202 and 204 are thicker, and the channel lengths are longer, than the gate oxide and channel lengths of the other transistors that are designed to operate at the lower power supply voltage VDD. In the illustrated embodiment, VDDX is about 3.3 volts and VDD is about 1.8 volts. Clock signal CLOCK is a "rail-to-rail" 3.3 volt signal. The trip point of inverter 190 is set to a predetermined trip point. The level shifting of the output of inverter 190 is performed by level shifter 196.

In operation, when the input to inverter 190 is a logic high voltage, the output of a inverter 190 is a logic low voltage. In level shifter 196, N-channel transistor 202 is substantially non-conductive and N-channel transistor 204 is conductive. The output of level shifter 196, at the drain of N-hannel transistor 204, is pulled low by N-channel transistor 204 which is caused to be conductive by the logic high CLOCK. The logic low voltage at the output of level shifter 196 causes P-channel transistor 198 to be conductive. The logic high voltage at the drain of N-channel transistor 202 causes P-channel transistor 200 to be non-conductive. Likewise, when the input to inverter 190 is a logic low voltage, the output of inverter 190 is a logic high voltage. N-channel transistor 202 is conductive and N-channel transistor 204 is substantially non-conductive. P-channel transistor 200 is conductive and P-channel transistor 198 is substantially non-conductive. The output of level shifter 196 is pulled to a logic high voltage by P-channel transistor 200. Therefore, as clock signal CLOCK toggles between a logic low voltage of 0 volts to a logic high voltage of about 3.3 volts, the output of level shifter 196 toggles between a logic high voltage of 1.8 volts and a logic low voltage of 0 volts. Because the gates of the pair of cross-coupled P-channel transistors 198 and 200 do not receive the higher input voltage of clock signal CLOCK, they can be have minimum channel lengths and relatively thin gate oxides for a speed advantage.

The output of level shifter 196 is the output signal CLKB. Output signal CLKB is inverted by inverter 216 to produce output signal CLK. Inverter 216 functions as an output driver circuit. CLK and CLKB are differential clock signals that can be used in the internal timing of memory 100 as described above in the discussion of FIG. 3.

Delay circuit 210, N-channel transistors 208 and 214, P-channel transistor 206, and inverter 212 are used to provide a self-timed internal clock pulse having a fixed duration and duty cycle independent of the duration and duty cycle of clock signal CLOCK. Delay circuit 210 is typically a series of inverters for providing a complemented (−δ) and delayed output signal labeled "RSTC". In the illustrated embodiment, the delay of delay circuit 210 is set to cause a clock high time of output signal CLK to be less than the clock high time of clock signal CLOCK. The self-timed function is similar to the self-timed function of clock input buffer circuit 122 and can be better understood by referring to the timing diagram of FIG. 6.

In FIG. 6, as discussed above, the rising edge of clock signal clock causes output signal CLK to transition from a logic low to a logic high. A predetermined time after the rising edge of clock signal CLOCK, delay circuit 210 provides a logic low RSTC to the gates of N-channel transistor 208, P-channel transistor 206, and to the input terminal of inverter 212. N-channel transistor 208 becomes substantially non-conductive, decoupling inverter the output leg of level shifter 196 from VSS. P-channel transistor 206 becomes conductive, causing the output of level shifter 196 to be pulled to a logic high voltage. N-channel transistor 214 is also conductive, pulling the output of inverter 216 low. Output signal CLK becomes a logic low voltage and output signal CLKB is a logic high voltage. The self-timing function provides the same advantages as discussed above for clock input buffer circuit 122.

As with clock input buffer circuit 122, the self-timing circuits of clock input buffer circuit 188 can be used to provide a low power inactive mode of operation for clock input buffer 188. Control signal SLEEPB is active at a logic low. When the control signal SLEEPB is a logic low, signal RSTC is forced to a logic low causing both N-channel transistor 214 and P-channel transistor 206 to be conductive, thus causing output signal CLK to be low and output signal CLKB to be high irregardless of the logic state of clock signal CLOCK. Also, N-channel transistor 208 is substantially non-conductive, preventing a current flow through the output leg of level shifter 196.

Clock input buffer circuits 122 and 188 provide the advantage of buffering and level shifting an externally provided clock signal with improved performance and speed as compared to existing clock buffering circuits. Also, the self-timing function fixes the duration and duty cycle of the internal clock signal to be determined by a predetermined delay, and thus independent of the external clock signal duration and duty cycle. In addition, a low power inactive mode can be easily incorporated into the self-timing function.

While the invention has been described in the context of a preferred embodiment, it will be apparent to those skilled in the art that the present invention may be modified in numerous ways and may assume many embodiments other than that specifically set out and described above. For example, the voltages to be level shifted may be different than those discussed above. Also, the input buffer can be used in any type of integrated circuit requiring an input clock signal for operation, and not just a memory. In addition, the input buffers can be configured to provide a single-ended output signal instead of the differential output signals shown. Accordingly, it is intended by the appended claims to cover all modifications of the invention which fall within the true scope of the invention.

We claim:

1. An integrated circuit device, comprising:
an input buffer, comprising:
an input stage having an input terminal for receiving an input signal, and an output terminal, the input stage coupled to a first power supply voltage terminal for receiving a first power supply voltage; and
a level shifter comprising:
a first P-channel transistor having a first current electrode coupled to a second power supply voltage terminal, a second current electrode, and a control electrode;
a second P-channel transistor having a first current electrode coupled to the second power supply voltage terminal, a second current electrode coupled to the control electrode of the first P-channel transistor, and a control electrode coupled to the second current electrode of the first P-channel transistor;
a first N-channel transistor having a first current electrode coupled to the second current electrode of the first P-channel transistor, a second current electrode coupled to ground, and a control electrode coupled to the output terminal of the input stage; and
a second N-channel transistor having a first current electrode coupled to the second current electrode of the second P-channel transistor, a second current electrode coupled to ground, and a control electrode coupled to the input terminal of the input stage; and
a delay circuit having an input for receiving the input signal at a first logic state, the delay circuit for causing a level shifted output signal to transition to a second logic state that is different than the first logic state, wherein a level shifted input sign has a duration and duty cycle that is independent of a duration and duty cycle of the input signal.

2. The integrated circuit device of claim 1, wherein the input signal is characterized as being a clock signal.

3. The integrated circuit device of claim 1, wherein the input stage is an inverter comprising:
a first P-channel transistor having a first current electrode coupled to the first power supply voltage terminal, a second current electrode forming an output terminal for the inverter, and a control electrode for receiving the input signal; and
a third N-channel transistor having a first current electrode coupled to the second current electrode of the first P-channel transistor, a second current electrode coupled to a ground terminal, and a control electrode for receiving the input signal.

4. The integrated circuit device of claim 1, further comprising a driver stage, coupled to the level shifter for receiving the level shifted output signal, the driver stage having an output terminal and is for driving a load of the memory device that is coupled to the output terminal of the driver stage.

5. The integrated circuit device of claim 4, wherein the delay circuit has an output terminal coupled to an output terminal of the level shifter.

6. The integrated circuit device of claim 4, wherein the delay circuit has an output terminal coupled to the output terminal of the driver stage.

7. A buffer circuit, comprising:
a first inverter, comprising:
a first P-channel transistor having a first current electrode coupled to a first power supply voltage t for receiving a first power supply voltage, a second current electrode for forming an output terminal of the first inverter, and a control electrode for receiving an input signal; and
a fist N-channel transistor have a first current electrode coupled to the second current electrode of the first P-channel transistor, a second current electode coupled to a ground terminal, and a control electrode coupled to the control electrode of the first P-channel transistor;
a level shifter comprising;
a second P-channel transistor having a first current electrode coupled to a second power supply voltage terminal for receiving a second power supply voltage that is lower than he first power supply voltage, a second current electrode, and a control electrode;
a third P-channel transistor having a first current electrode coupled to the second power supply voltage terminal, a second current electrode coupled to the control electrode of the second P-channel transistor, and a control electrode coupled to the second current electrode of the second P-channel transistor;
a second N-channel transistor having a first current electrode coupled to the second current electode of the second P-channel transistor, a second current electrode coupled to the ground terminal, and a control electrode coupled to the output terminal of the first inverter; and
a third N-chapel transistor having a first current electrode coupled to the second current electrode of the third P-channel transistor, a second current electrode, and a control electode coupled to receive the input signal;
a second inverter having series-connected P-channel and N-channel transistors coupled between the second power supply voltage terminal and the ground terminal, the P-channel and N-channel transistors having control electrodes coupled to the second current electrode of the second P-channel transistor, and an output terminal formed between the series-connected P-channel and N-channel transistors for providing a buffered input signal;
a third inverter coupled to the output terminal of the second inverter and an output for providing a logical complement of the buffered input signal; and
a delay circuit having an input for receiving the input signal at a first logic state, the delay circuit for causing the level shifted output signal to transition to a second logic state that is different tan the first logic state, wherein the level shifted input signal has a duration and duty cycle that is independent of a duration and duty cycle of the input signal.

8. The buffer circuit of claim 7, further comprising: a delay circuit, comprising:
a delay element having an input terminal for receiving the input signal, and an output terminal;
a fourth P-channel transistor having a first current electrode coupled to the second power supply voltage terminal, a second current electrode coupled to the output terminal of the second inverter, and a control electrode coupled to the output terminal of the delay element;
a fourth N-channel transistor coupled in series with the series-connected P-channel and N-channel transistors and having a control electrode coupled to the output terminal of the delay element;
fourth inverter having an input terminal coupled to the output terminal of the delay element, and an output terminal; and a fifth N-channel transistor having a first current electrode coupled to the output terminal of the third inverter, a second current electrode coupled to the ground terminal, and control electrode coupled to the input terminal of the fourth inverter.

9. The buffer circuit of claim 7, further comprising:

a second inverter having series-connected P-channel and N-channel transistors coupled between the second power supply voltage terminal and the ground terminal, the P-channel and N-channel transistors having control electrodes coupled to the second current electrode of the third P-channel transistor, and an output terminal formed between the series-connected P-channel and N-channel transistors for providing a buffered input signal.

10. The buffer circuit of claim 9, further comprising: a delay circuit, comprising:

a delay element having and input terminal for receiving the input signal, and an output terminal;

a fourth P-channel transistor having a first current electrode coupled to the second power supply voltage terminal, a second current electrode coupled to the second current electrode of the third P-channel transistor, and a gate electrode coupled to the output terminal of the delay element;

a fourth N-channel transistor coupled between the third N-channel transistor and the ground terminal, and a control electrode coupled to the output terminal of the delay element;

a third inverter having an input terminal coupled to the output terminal of the delay element, and an output terminal; and a fifth N-channel transistor having a first current electrode coupled to the output terminal of the second inverter, a second current electrode coupled to the ground terminal, and a control electrode coupled to the output terminal of the third inverter.

11. The buffer circuit of claim 7, wherein the input signal is characterized as being a clock signal.

12. The buffer circuit of claim 7, wherein the buffer circuit is for buffering an input clock signal for a synchronous static random access memory.

13. The buffer circuit of claim 7, wherein a drive strength of the first P-channel transistor is greater than a drive strength of the first N-channel transistor.

14. An input buffer circuit, comprising:

a first stage having an input terminal for receiving an input signal, and an output terminal, the first stage coupled to a first power supply voltage terminal for receiving a first power supply voltage;

a level shifter having a pair of cross-coupled P-channel transistors coupled to a second power supply voltage teal for receiving a second power supply voltage, the second power supply voltage being different than the first power supply voltage, the cross-coupled P-channel transistors being coupled to first current electrodes of first and second N-channel transistors, and where a gate of the first N-channel transistor is coupled to the output terminal of the input stage and a gate of the second N-channel transistor is coupled to receive the input signal, the level shifter providing a level shifted output signal at the first current electrode of the second N-channel transistor; and a delay circuit, comprising:

a delay element having and input terminal for receiving the input signal, and an output terminal;

a first P-channel transistor having a first current electrode coupled to the second power supply voltage terminal, a second current electrode coupled to the first current electrode of the second N-channel transistor, and a gate electrode coupled to the output terminal of the delay element; and a third N-channel transistor having a first current electrode coupled to a second current electrode of the second N-channel transistor, a second current electrode coupled to a ground terminal, and a control electrode coupled to the output terminal of the delay element, wherein the delay circuit for receiving the input signal at a first logic state, the delay circuit for causing be level shifted output signal to transition to a second logic state that is different than the first logic state, wherein the level shifted input signal has a duration and duty cycle tat is independent of a duration and duty cycle of the input signal.

15. The buffer circuit of claim 14, wherein the first stage comprises:

a second P-channel transistor having a first current electrode coupled to the first power supply voltage terminal, a second current electrode coupled to the first current electrode of the first N-channel transistor, and a gate electrode for receiving the input signal; and a fourth N-channel transistor having a first current electrode coupled to the second current electrode of the second P-channel transistor, a second current electrode coupled to the ground terminal, and a gate electrode coupled to the gate electrode of the second P-channel transistor.

16. The buffer circuit of claim 14, further comprising:

a first inverter having an input terminal coupled to the first current electrode of the second N-channel transistor;

a second inverter having an input terminal coupled to the output terminal of the delay element, and an output terminal; and a fourth N-channel transistor having a first current electrode coupled to the output terminal of the first inverter, a second current electrode coupled to the ground terminal, and a control electrode coupled to the output terminal of the second inverter.

17. The buffer circuit of claim 14, wherein the delay circuit receives a control signal for causing the first P-channel transistor to be conductive and the third N-channel transistor to be substantially non-conductive, whereby the buffer circuit enters an inactive mode.

18. The buffer circuit of claim 14, wherein the buffer circuit is an input buffer circuit for buffering a clock signal for use in a synchronous static random access memory.

* * * * *

UNITED STATES PATENT AND TRADEMARK OFFICE
CERTIFICATE OF CORRECTION

PATENT NO.    : 6,275,070 B1
DATED         : August 14, 2001
INVENTOR(S)   : Pantelakis et al.

It is certified that error appears in the above-identified patent and that said Letters Patent is hereby corrected as shown below:

Column 11,
Line 66, change "t" to -- terminal --

Column 12,
Line 14, change "he" to -- the --
Line 47, change "tan" to -- than --
Line 65, add "a" in front of fourth Column 14,
Line 6, change "and" to -- an --
Line 22, change "be" to -- the --.

Signed and Sealed this

Seventh Day of May, 2002

Attest:

Attesting Officer

JAMES E. ROGAN
Director of the United States Patent and Trademark Office